(12) United States Patent
Yun et al.

(10) Patent No.: US 12,278,121 B2
(45) Date of Patent: Apr. 15, 2025

(54) SUPPORT UNIT, SUBSTRATE TREATING APPARATUS INCLUDING THE SAME, AND SUBSTRATE TREATING METHOD

(71) Applicant: SEMES CO., LTD., Cheonan-si (KR)

(72) Inventors: Kangseop Yun, Cheonan-si (KR); Seung Hoon Oh, Cheonan-si (KR); Ye Jin Choi, Seoul (KR); Youngil Lee, Cheonan-si (KR); Byungsun Bang, Hwaseong-si (KR); Jungbong Choi, Suwon-si (KR); Gui Su Park, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 1011 days.

(21) Appl. No.: 16/986,418

(22) Filed: Aug. 6, 2020

(65) Prior Publication Data

US 2021/0050235 A1    Feb. 18, 2021

(30) Foreign Application Priority Data

Aug. 14, 2019    (KR) .......................... 10-2019-0099574

(51) Int. Cl.
*H01L 21/67* (2006.01)
*H01L 21/687* (2006.01)

(52) U.S. Cl.
CPC .................. *H01L 21/67115* (2013.01); *H01L 21/67109* (2013.01); *H01L 21/6719* (2013.01); *H01L 21/68764* (2013.01)

(58) Field of Classification Search
CPC ......... H01L 21/67115; H01L 21/67109; H01L 21/6719; H01L 21/68764; H01L 21/67103;

(Continued)

(56) References Cited

U.S. PATENT DOCUMENTS

| 6,074,696 A | 6/2000 | Sato |
| 2002/0023914 A1* | 2/2002 | Kitagawa ............... H05B 3/143 219/468.1 |

(Continued)

FOREIGN PATENT DOCUMENTS

| JP | 2018-085374 A | 5/2018 |
| KR | 100838874 B1 | 6/2008 |

(Continued)

OTHER PUBLICATIONS

Office Action for Korean Application No. 10-2019-0099574 dated Sep. 24, 2020.
Office Action for corresponding Korean Application No. 10-2019-0099574 dated May 24, 2021.

(Continued)

*Primary Examiner* — Michael E Barr
*Assistant Examiner* — Thomas Bucci
(74) *Attorney, Agent, or Firm* — Harness, Dickey & Pierce, P.L.C.

(57) ABSTRACT

The inventive concept provides a support unit for supporting a substrate. The support unit includes a support plate that has an interior space and on which the substrate is placed, a heating member that is provided in the interior space and that heats the substrate placed on the support plate, a heat insulating plate provided in the interior space and disposed under the heating member, a reflective plate provided in the interior space and disposed under the heat insulating plate, and a heat dissipation plate provided in the interior space and disposed under the a reflective plate.

21 Claims, 9 Drawing Sheets

(58) Field of Classification Search
CPC ......... H01L 21/68728; H01L 21/67051; H01L 21/6708; H01L 21/68714; H01L 21/02052; H01L 21/02307; H01L 21/02343; H01L 21/324; H01L 21/67028; H01L 21/6715; H01L 21/67248; H01L 21/683
USPC ........................................................ 134/105
See application file for complete search history.

(56) References Cited

U.S. PATENT DOCUMENTS

| | | |
|---|---|---|
| 2003/0066638 A1 | 4/2003 | Qu et al. |
| 2003/0161088 A1* | 8/2003 | Migita ................ H01L 21/6831 361/234 |
| 2004/0045813 A1* | 3/2004 | Kanno ................. C25D 17/001 204/286.1 |
| 2005/0045104 A1* | 3/2005 | Arai ................. H01L 21/67109 118/724 |
| 2006/0096972 A1* | 5/2006 | Nakamura ........ H01L 21/67103 219/544 |
| 2010/0059182 A1 | 3/2010 | Lee et al. |
| 2012/0176692 A1 | 7/2012 | Yamawaku et al. |
| 2014/0090783 A1* | 4/2014 | Kim ................. H01J 37/32651 156/345.48 |
| 2014/0256160 A1 | 9/2014 | Wada et al. |
| 2015/0034133 A1* | 2/2015 | Kim ................. H01L 21/67051 134/105 |
| 2015/0214016 A1* | 7/2015 | Ham ................. H01J 37/32972 118/712 |
| 2016/0013079 A1* | 1/2016 | Choi ................. H01L 21/67051 156/345.21 |
| 2016/0021702 A1* | 1/2016 | Jang ..................... H05B 3/0047 134/105 |
| 2019/0311923 A1* | 10/2019 | Kim ..................... H01L 21/6708 |

FOREIGN PATENT DOCUMENTS

| | | |
|---|---|---|
| KR | 2009-0021968 A | 3/2009 |
| KR | 2012-0013125 A | 2/2012 |
| KR | 2015-0015346 A | 2/2015 |
| KR | 101529304 B1 | 6/2015 |
| KR | 10-2015-0113257 A | 10/2015 |
| KR | 10-2015-0136216 A | 12/2015 |
| KR | 2016-0008065 A | 1/2016 |
| KR | 10-2019-0037835 A | 4/2019 |
| TW | 201220395 A | 5/2012 |
| WO | WO-2018/163386 A1 | 9/2018 |

OTHER PUBLICATIONS

Office Action for Korean Application No. 10-2021-0110054 dated Jul. 5, 2022.
Office Action for Taiwanese Application No. 11120591990 dated Jun. 17, 2022.
Notice of Allowance for corresponding Korean Application No. 10-2019-0099574 dated May 24, 2021.
Office Action for Korean Application No. 10-2009-0021968 dated Jul. 5, 2022.
Chinese Office Action dated Dec. 4, 2023 issued in Chinese Patent Application No. 202010817359.3.

* cited by examiner

SUPPORT UNIT, SUBSTRATE TREATING APPARATUS INCLUDING THE SAME, AND SUBSTRATE TREATING METHOD

CROSS-REFERENCE TO RELATED APPLICATIONS

A claim for priority under 35 U.S.C. § 119 is made to Korean Patent Application No. 10-2019-0099574 filed on Aug. 14, 2019, in the Korean Intellectual Property Office, the entire contents of which are hereby incorporated by reference.

BACKGROUND

Embodiments of the inventive concept described herein relate to a support unit, a substrate treating apparatus including the same, and a substrate treating method, and more particularly, relate to a substrate treating apparatus for performing a substrate treating process while heating a substrate.

In general, various processes such as a photoresist coating process, a developing process, an etching process, an ashing process, and the like are performed to treat a glass substrate or a wafer in a process of manufacturing a flat panel display device or semiconductor devices. In each of the processes, a wet cleaning process using a chemical or deionized water and a drying process for drying the chemical or the deionized water remaining on the surface of a substrate are performed to remove various contaminants adhering to the substrate.

Recently, an etching process of selectively removing a silicon nitride film and a silicon oxide film by using a chemical, such as a sulfuric acid or a phosphoric acid, at high temperature has been used. In a substrate treating apparatus using a high-temperature chemical, an apparatus for heating a substrate is used to improve an etching rate. In general, the apparatus for heating the substrate includes a lamp that is disposed in a spin head and that heats the substrate. The lamp disposed in the spin head generates heat, and the heat generated by the lamp is transferred to the substrate to heat the substrate.

With a decrease in the critical dimension (CD) between patterns formed on a substrate, fine processing of the substrate is required. For example, in an etching process of selectively removing a silicon nitride film and a silicon oxide film on a substrate by using a chemical, it is required to heat the substrate to a higher temperature and increase the time during which the substrate is maintained at high temperature. A method of increasing thermal energy generated by a lamp may be considered as a method of raising the temperature of the substrate. However, the method raises the temperature of an actuator that rotates a spin head. In this case, the actuator is difficult to normally operate or involves a high risk of failure.

SUMMARY

Embodiments of the inventive concept provide a support unit for efficiently treating a substrate, a substrate treating apparatus including the support unit, and a substrate treating method.

Furthermore, embodiments of the inventive concept provide a support unit for improving an etching rate for a substrate, a substrate treating apparatus including the support unit, and a substrate treating method.

In addition, embodiments of the inventive concept provide a support unit for minimizing abnormal operation of a spin actuator that rotates a substrate or the number of times that the spin actuator fails, a substrate treating apparatus including the support unit, and a substrate treating method.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, an apparatus for treating a substrate includes a support unit that supports the substrate and a liquid supply unit that supplies a treatment liquid to the substrate supported on the support unit, and the support unit includes a support plate on which the substrate is placed, a heating member that is disposed inside the support plate and that heats the substrate placed on the support plate, a heat insulating plate provided inside the support plate and disposed under the heating member, a reflective plate provided inside the support plate and disposed under the heat insulating plate, and a heat dissipation plate provided inside the support plate and disposed under the reflective plate.

According to an embodiment, the heating member may include a lamp that emits light.

According to an embodiment, the lamp may emit light having a wavelength in an infrared range.

According to an embodiment, the reflective plate is formed of a material that reflects the light having the wavelength in the infrared range.

According to an embodiment, the heat insulating plate may be formed of a transparent material.

According to an embodiment, the heat insulating plate may be formed of a material containing ceramic or glass.

According to an embodiment, the heat dissipation plate may be formed of a material containing metal.

According to an embodiment, the heat dissipation plate may be formed of a material having a higher thermal conductivity than the heat insulating plate.

According to an embodiment, the support plate may be provided to be rotatable, and the heating member, the heat insulating plate, the reflective plate, and the heat dissipation plate may be located independently from rotation of the support plate.

According to an embodiment, the lamp may include a plurality of ring-shaped lamps that have different radii and that are concentric with one another.

According to an embodiment, a fluid channel through which a cooling fluid flows may be formed inside the heat dissipation plate.

According to an embodiment, the apparatus may further include a cooling member that supplies the cooling fluid into the fluid channel and a controller that controls the heating member and the cooling member. The controller may raise temperature of the substrate to a preset target temperature, may maintain the temperature of the substrate at the target temperature for a set period of time, and may control the heating member and the cooling member to cool the substrate when the set period of time elapses.

According to an exemplary embodiment, a support unit for supporting a substrate includes a support plate that has an interior space and on which the substrate is placed, a heating member that is provided in the interior space and that heats the substrate placed on the support plate, a heat insulating plate provided in the interior space and disposed under the heating member, a reflective plate provided in the interior space and disposed under the heat insulating plate, and a heat dissipation plate provided in the interior space and disposed under the heat insulating plate.

According to an embodiment, the heating member may include a lamp that emits light, and the heat insulating plate may be formed of a transparent material.

According to an embodiment, the heat insulating plate may be formed of a material containing glass.

According to an embodiment, the lamp may emit light having a wavelength in an infrared range, and the reflective plate may be formed of a material that reflects the light.

According to an embodiment, the lamp may include a plurality of ring-shaped lamps that have different radii and that are concentric with one another.

According to an embodiment, a fluid channel through which a cooling fluid flows may be formed inside the heat dissipation plate.

According to an embodiment, the heat dissipation plate may be formed of a material having a higher thermal conductivity than the heat insulating plate.

According to an exemplary embodiment, provided is a method for treating a substrate, in which the substrate is treated by supplying the treatment liquid in a heated state to the substrate and the substrate is heated while the treatment liquid is supplied to the substrate.

According to an embodiment, the method may include a heating step of heating the substrate supported on the support plate to a preset target temperature, a maintaining step of maintaining temperature of the substrate at the target temperature for a set period of time, and a cooling step of cooling the substrate when the set period of time elapses.

According to an embodiment, the treatment liquid may include a sulfuric acid or a phosphoric acid.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
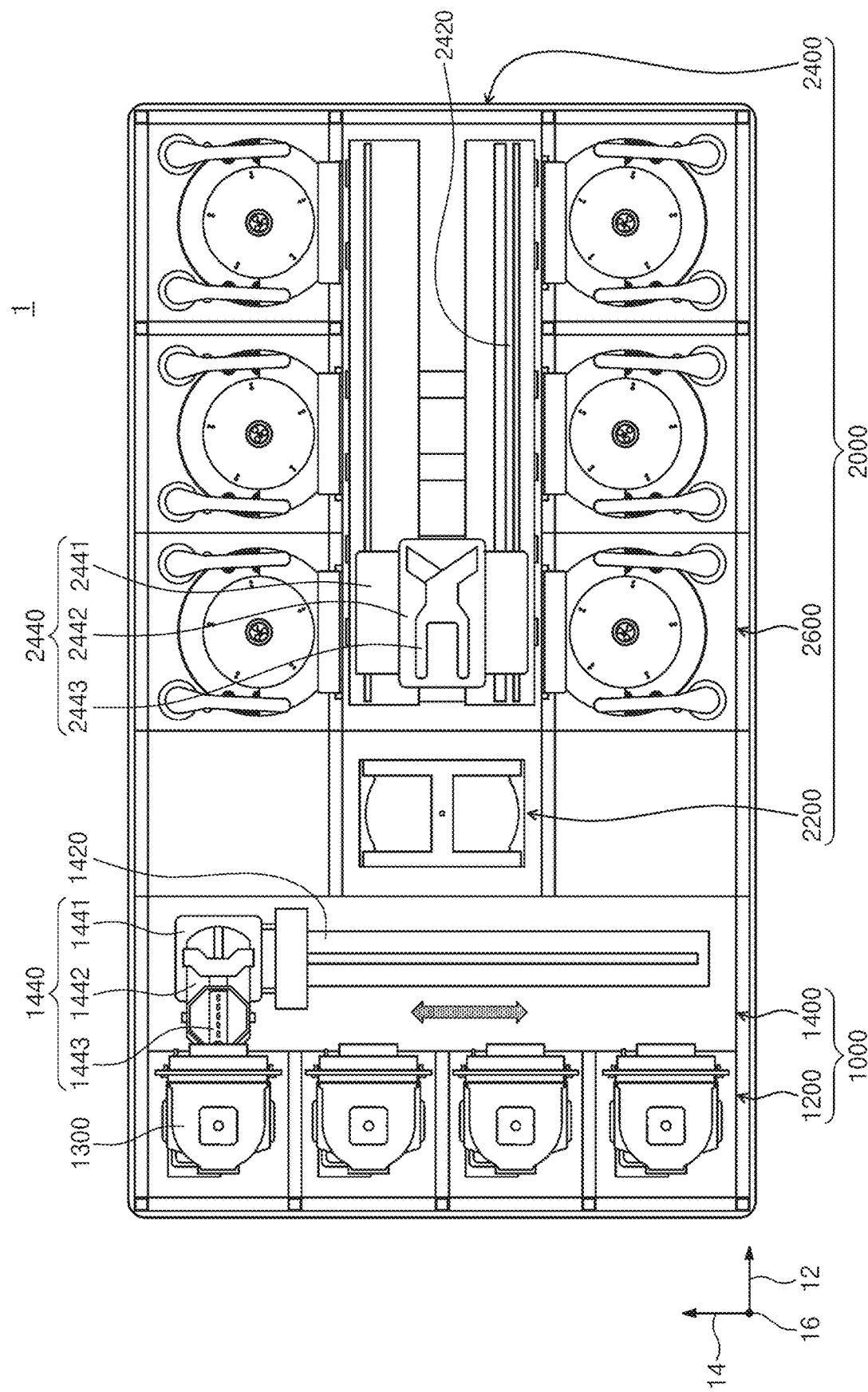
FIG. 1 is a schematic plan view illustrating substrate treating equipment including a substrate treating apparatus according to an embodiment of the inventive concept.

Hereinafter, embodiments of the inventive concept will be described in detail with reference to the accompanying drawings such that those skilled in the art to which the inventive concept pertains can readily carry out the inventive concept. However, the inventive concept may be implemented in various different forms and is not limited to the embodiments described herein. Furthermore, in describing the embodiments of the inventive concept, detailed descriptions related to well-known functions or configurations will be omitted when they may make subject matters of the inventive concept unnecessarily obscure. In addition, components performing similar functions and operations are provided with identical reference numerals throughout the accompanying drawings.

The terms "include" and "comprise" in the specification are "open type" expressions just to say that the corresponding components exist and, unless specifically described to the contrary, do not exclude but may include additional components. Specifically, it should be understood that the terms "include", "comprise", and "have", when used herein, specify the presence of stated features, integers, steps, operations, components, and/or parts, but do not preclude the presence or addition of one or more other features, integers, steps, operations, components, parts, and/or groups thereof.

The terms of a singular form may include plural forms unless otherwise specified. Furthermore, in the drawings, the shapes and dimensions of components may be exaggerated for clarity of illustration.

FIG. 1 is a schematic plan view illustrating substrate treating equipment 1 of the inventive concept.

Referring to FIG. 1, the substrate treating equipment 1 includes an index module 1000 and a process module 2000. The index module 1000 includes a load port 1200 and a transfer frame 1400. The load port 1200, the transfer frame 1400, and the process module 2000 are sequentially arranged in a row. Hereinafter, a direction in which the load port 1200, the transfer frame 1400, and the process module 2000 are arranged is referred to as a first direction 12. A direction perpendicular to the first direction 12 when viewed from above is referred to as a second direction 14, and a direction perpendicular to the plane including the first direction 12 and the second direction 14 is referred to as a third direction 16.

A carrier 1300, in which substrates W are received, is seated on the load port 1200. A plurality of load ports 1200 may be provided. The load ports 1200 may be disposed in a row along the second direction 14. FIG. 1 illustrates an example that the index module 1000 includes four load ports 1200. However, the number of load ports 1200 may be increased or decreased depending on conditions such as the process efficiency and the footprint of the process module 2000. Slots (not illustrated) that support the peripheries of the substrates W are formed in the carrier 1300. The slots are arranged in the third direction 16. The substrates W are stacked in the carrier 1300 in a state of being spaced apart from each other along the third direction 16. A front opening unified pod (FOUP) may be used as the carrier 1300.

The process module 2000 includes a buffer unit 2200, a transfer chamber 2400, and process chambers 2600. The transfer chamber 2400 is disposed such that the lengthwise direction thereof is parallel to the first direction 12. The process chambers 2600 are disposed on one side and an opposite side of the transfer chamber 2400 along the second direction 14. The process chambers 2600 on the one side of the transfer chamber 2400 and the process chambers 2600 on the opposite side of the transfer chamber 2400 are located in a symmetric arrangement with respect to the transfer chamber 2400. Some of the process chambers 2600 are disposed along the lengthwise direction of the transfer chamber 2400. Furthermore, other process chambers 2600 are stacked one above another. That is, the process chambers 2600 may be disposed in an A×B array (A and B being natural numbers of 1 or larger) on the one side of the transfer chamber 2400. Here, "A" is the number of process chambers 2600 provided in a row along the first direction 12, and "B" is the number of process chambers 2600 provided in a column along the third direction 16. When four or six process chambers 2600 are provided on the one side of the transfer chamber 2400, the process chambers 2600 may be disposed in a 2×2 or 3×2 array. The number of process chambers 2600 may be increased or decreased. Alternatively, the process chambers 2600 may be provided on only the one side of the transfer chamber 2400. In another case, the process chambers 2600 may be provided in a single layer on the one side and the opposite side of the transfer chamber 2400.

The buffer unit 2200 is disposed between the transfer frame 1400 and the transfer chamber 2400. The buffer unit 2200 provides a space in which the substrates W stay before transferred between the transfer chamber 2400 and the transfer frame 1400. The buffer unit 2200 has a plurality of slots (not illustrated) in which the substrates W are placed. The slots (not illustrated) are spaced apart from each other along the third direction 16. The buffer unit 2200 is open at one side that faces the transfer frame 1400 and at an opposite side that faces the transfer chamber 2400.

The transfer frame 1400 transfers the substrates W between the carriers 1300 seated on the load ports 1200 and the buffer unit 2200. An index rail 1420 and an index robot 1440 are provided in the transfer frame 1400. The index rail 1420 is disposed such that the lengthwise direction thereof is parallel to the second direction 14. The index robot 1440 is installed on the index rail 1420 and is rectilinearly moved along the index rail 1420 in the second direction 14. The index robot 1440 has a base 1441, a body 1442, and an index arm 1443. The base 1441 is installed so as to be movable along the index rail 1420. The body 1442 is coupled to the base 1441. The body 1442 is movable on the base 1441 along the third direction 16. Furthermore, the body 1442 is rotatable on the base 1441. The index arm 1443 is coupled to the body 1442 and is movable forward and backward relative to the body 1442. A plurality of index arms 1443 may be provided. The index arms 1443 may be individually driven. The index arms 1443 are stacked one above another along the third direction 16 with a spacing gap therebetween. Some of the index arms 1443 may be used to transfer the substrates W from the process module 2000 to the carriers 1300, and the other index arms 1443 may be used to transfer the substrates W from the carriers 1300 to the process module 2000. Accordingly, particles generated from the substrates W that are to be treated may be prevented from adhering to the treated substrates W in a process in which the index robot 1440 transfers the substrates W between the carriers 1300 and the process module 2000.

The transfer chamber 2400 transfers the substrates W between the buffer unit 2200 and the process chambers 2600 and between the process chambers 2600. A guide rail 2420 and a main robot 2440 are provided in the transfer chamber 2400. The guide rail 2420 is disposed such that the lengthwise direction thereof is parallel to the first direction 12. The main robot 2440 is installed on the guide rail 2420 and is rectilinearly moved on the guide rail 2420 along the first direction 12. The main robot 2440 has a base 2441, a body 2442, and a main arm 2443. The base 2441 is installed so as to be movable along the guide rail 2420. The body 2442 is coupled to the base 2441. The body 2442 is movable on the base 2441 along the third direction 16. Furthermore, the body 2442 is rotatable on the base 2441. The main arm 2443 is coupled to the body 2442 and is movable forward and backward relative to the body 2442. A plurality of main arms 2443 may be provided. The main arms 2443 may be individually driven. The main arms 2443 are stacked one above another along the third direction 16 with a spacing gap therebetween. The main arms 2443 used to transfer the substrates W from the buffer unit 2200 to the process chambers 2600 may differ from the main arms 2443 used to transfer the substrates W from the process chambers 2600 to the buffer unit 2200.

Each of the process chambers 2600 has a substrate treating apparatus 10 therein, in which a cleaning process is performed on a substrate W. The substrate treating apparatuses 10 in the respective process chambers 2600 may have different structures depending on the types of cleaning processes performed by the substrate treating apparatuses 10. Selectively, the substrate treating apparatuses 10 in the respective process chambers 2600 may have the same structure. Selectively, the process chambers 2600 may be divided into a plurality of groups. The substrate treating apparatuses 10 in the process chambers 2600 belonging to the same group may have the same structure, and the substrate treating apparatuses 10 in the process chambers 2600 belonging to different groups may have different structures. For example, in a case where the process chambers 2600 are divided into two groups, a first group of process chambers 2600 may be disposed on the one side of the transfer chamber 2400, and a second group of process chambers 2600 may be disposed on the opposite side of the transfer chamber 2400. Selectively, on the one side and the opposite side of the transfer chamber 2400, the first group of process chambers 2600 may be provided in a lower layer, and the second group of process chambers 2600 may be provided in an upper layer. The first group of process chambers 2600 may be distinguished from the second group of process chambers 2600 depending on the types of chemicals used and the types of cleaning methods.

In the following embodiments, an apparatus for cleaning a substrate W using treatment fluids, such as a high-temperature sulfuric acid, an alkaline chemical, an acidic chemical, a rinsing solution, and a drying gas, will be described as an example. However, without being limited thereto, the spirit and scope of the inventive concept are applicable to various types of apparatuses that perform a process, such as an etching process, while rotating a substrate W.

Figure 2:
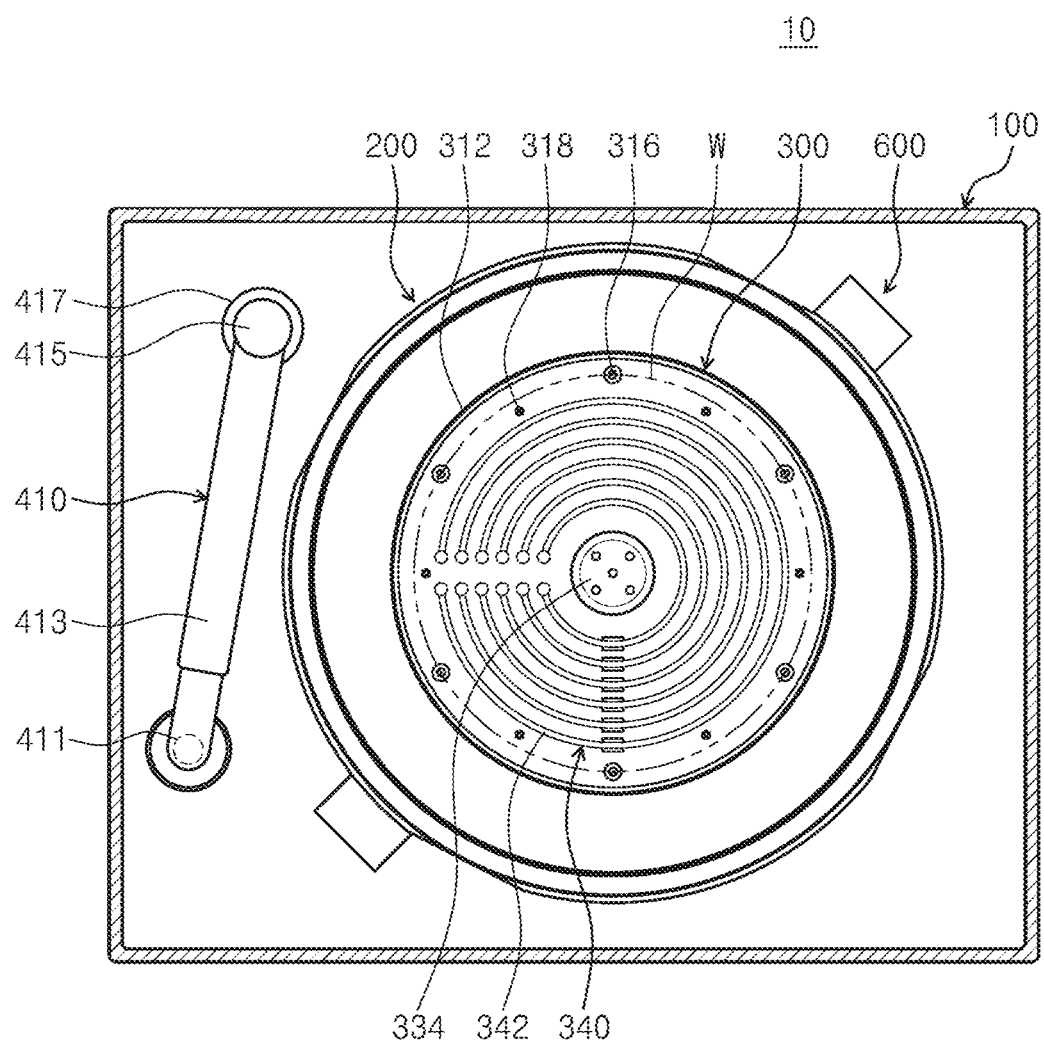
FIG. 2 is a plan view illustrating the substrate treating apparatus of FIG. 1.
Figure 3:
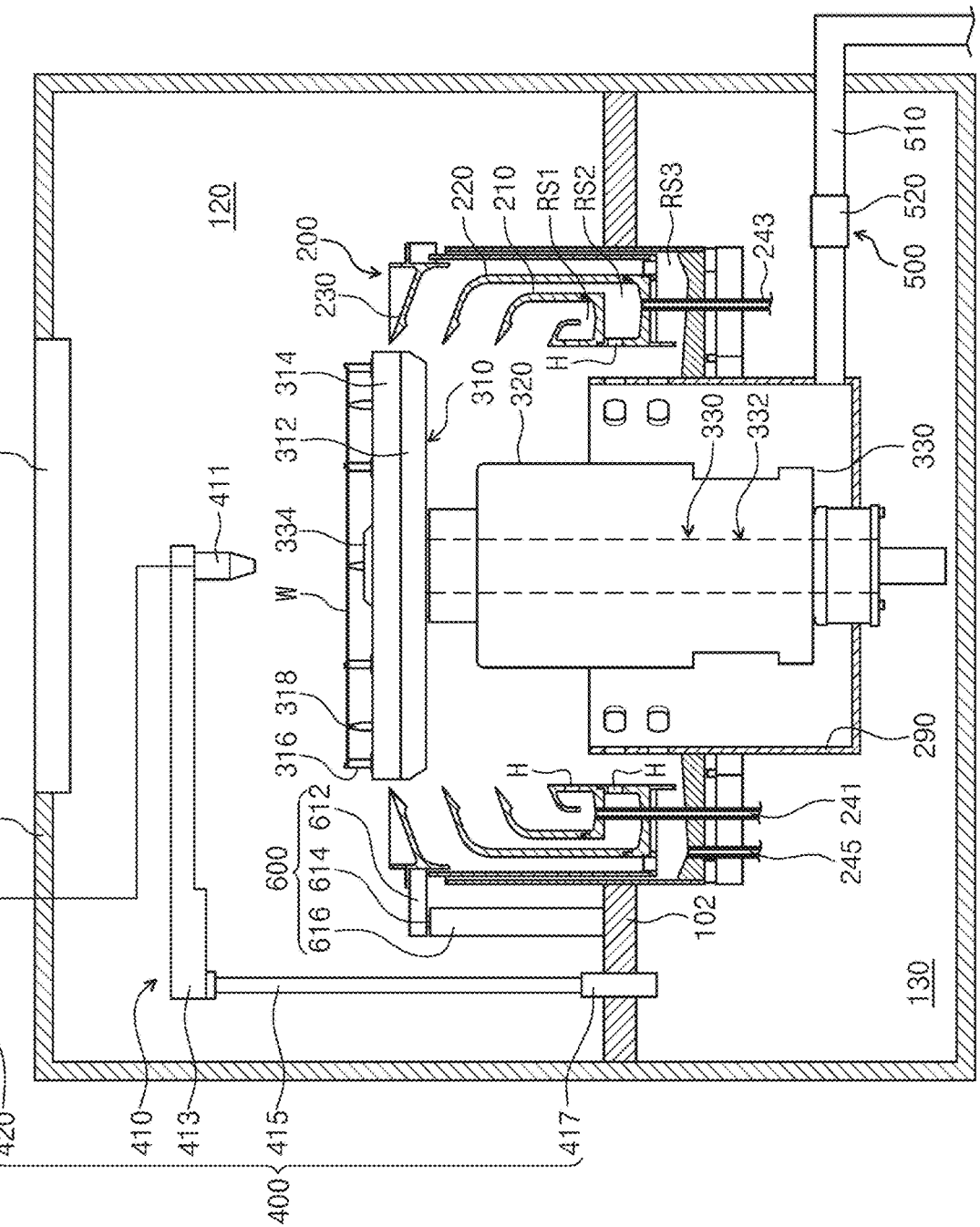
FIG. 3 is a sectional view illustrating the substrate treating apparatus of FIG. 1.

FIG. 2 is a plan view illustrating the substrate treating apparatus of FIG. 1, and FIG. 3 is a sectional view illustrating the substrate treating apparatus of FIG. 1. Referring to FIGS. 2 and 3, the substrate treating apparatus 10 includes a chamber 100, a bowl 200, a support unit 300, a liquid supply unit for alternatively, a liquid supply) 400, an exhaust unit 500, and a lifting unit 600.

The chamber 100 has a sealed interior space. The chamber 100 is equipped with an air-flow supply member 110 at the top thereof. The air-flow supply member 110 forms a downward air flow in the chamber 100.

The air-flow supply member 110 filters and supplies high-humidity outside air into the chamber 100. The high-humidity outside air passes through the air-flow supply member 110 and forms a downward air flow while being supplied into the chamber 100. The downward air flow provides a uniform air flow over the substrate W and releases contaminants generated in a process of treating the surface of the substrate W with the treatment fluids, to the exhaust unit 500 through recovery bowls 210, 220, and 230 of the bowl 200.

The chamber 100 is divided into a process area 120 and a maintenance area 130 by a horizontal partition wall 102. The bowl 120 and the support unit 300 are located in the process area 120. In addition to recovery lines 241, 243, and 245 connected with the bowl 200 and an exhaust line 510, an actuator of the lifting unit 600, an actuator connected with the liquid supply unit 400, a supply line, and the like are located in the maintenance area 130. The maintenance area 130 is isolated from the process area 120.

The bowl 200 has an open-topped cylindrical shape and has a process space for treating the substrate W. The open top side of the bowl 200 serves as a passage through which the substrate W is carried into or out of the bowl 200. The support unit 300 is located in the process space. The support unit 300 rotates the substrate W while supporting the substrate W during a process.

The bowl 200 has, in the bottom thereof, a lower space to which an exhaust duct 290 is connected for forced exhaust. The bowl 200 includes the first to third recovery bowls 210, 220, and 230 that are disposed in multiple stages and that take in the treatment fluids and gases scattered over the rotating substrate W.

The first to third annular recovery bowls 210, 220, and 230 have exhaust holes H that connect to one common annular space. Specifically, each of the first to third recovery bowls 210, 220, and 230 includes a bottom wall having an annular ring shape and a sidewall having a cylindrical shape extending from the bottom wall. The second recovery bowl 220 surrounds the first recovery bowl 210 and is spaced apart from the first recovery bowl 210. The third recovery bowl 230 surrounds the second recovery bowl 220 and is spaced apart from the second recovery bowl 220.

The first to third recovery bowls 210, 220, and 230 have first to third recovery spaces RS1, RS2, and RS3, respectively, into which gas flows containing treatment liquids and fumes scattered from the substrate W are introduced. The first recovery space RS1 is defined by the first recovery bowl 110, the second recovery space RS2 is defined by the spacing space between the first recovery bowl 110 and the second recovery bowl 120, and the third recovery space RS3 is defined by the spacing space between the second recovery bowl 120 and the third recovery bowl 130.

The top side of each of the first to third recovery bowls 210, 220, and 230 is open in the center. The first to third recovery bowls 210, 220, and 230 each include an inclined wall that is upwardly inclined such that the distance between the inclined wall and the corresponding bottom wall gradually increases from the sidewall to the open top side. The treatment liquids scattered from the substrate W flow into the recovery spaces RS1, RS2, and RS3 along the top sides of the first to third recovery bowls 210, 220, and 230.

A first treatment liquid introduced into the first recovery space RS1 is discharged to the outside through the first recovery line 241. A second treatment liquid introduced into the second recovery space RS2 is discharged to the outside through the second recovery line 243. A third treatment liquid introduced into the third recovery space RS3 is discharged to the outside through the third recovery line 245.

The liquid supply unit 400 may supply a treatment liquid to the substrate W to treat the substrate W. The liquid supply unit 400 may supply a heated treatment liquid to the substrate W. The treatment liquid may be a high-temperature chemical for etching the surface of the substrate W. For example, the chemical may be a sulfuric acid, a phosphoric acid, or a mixture thereof.

A liquid nozzle member 410 includes a nozzle 411, a nozzle arm 413, a support rod 415, and a nozzle actuator 417. The nozzle 411 receives the treatment liquid from a supply unit 420. The nozzle 411 dispenses the treatment liquid onto the surface of the substrate W. The nozzle arm 413 extends in one direction and is equipped with the nozzle 411 at the tip end thereof. The nozzle arm 413 supports the nozzle 411. The nozzle arm 413 is equipped with the support rod 415 at a rear end thereof. The support rod 415 is located on the bottom of the nozzle arm 413. The support rod 415 is disposed perpendicular to the nozzle arm 413. The nozzle actuator 417 is provided at a lower end of the support rod 415. The nozzle actuator 417 rotates the support rod 415 about the longitudinal axis of the support rod 415. The nozzle arm 413 and the nozzle 411 swing about the support rod 415 by the rotation of the support rod 415. The nozzle 411 may swing between the outside and the inside of the bowl 200. The nozzle 411 may dispense the treatment liquid while swinging between the center of the substrate W and the edge region thereof.

The exhaust unit 500 may evacuate the inside of the bowl 200. For example, the exhaust unit 500 applies exhaust pressure (suction pressure) to a recovery bowl that recovers the treatment liquid during a process, among the first to third recovery bowls 210, 220, and 230. The exhaust unit 500 includes the exhaust line 510 connected with the exhaust duct 290 and a damper 520. The exhaust line 510 receives exhaust pressure from an exhaust pump (not illustrated) and is connected with a main exhaust line buried in a bottom space of a semiconductor manufacturing line.

The bowl 200 is coupled with the lifting unit 600 that changes the vertical position of the bowl 200. The lifting unit 600 rectilinearly moves the bowl 200 in up/down directions. As the bowl 200 is vertically moved, the height of the bowl 200 relative to the support unit 300 is changed.

The lifting unit 600 includes a bracket 612, a movable shaft 614, and an actuator 616. The bracket 612 is fixedly attached to an outer wall of the bowl 200. The movable shaft 614 is fixedly coupled to the bracket 612 and is vertically moved by the actuator 616. When the substrate W is loaded onto or unloaded from the support unit 300, the bowls 200 is lowered such that the support unit 300 protrudes beyond the bowl 200. Furthermore, during a process, the height of the bowl 200 is adjusted depending on the types of treatment liquids supplied to the substrate W, to allow the treatment liquids to be introduced into the preset recovery bowls 210, 220, and 230, respectively. The bowl 200 may vary the types of treatment liquids and pollutant gases recovered into the respective recovery spaces RS1, RS2, and RS3.

Figure 4:
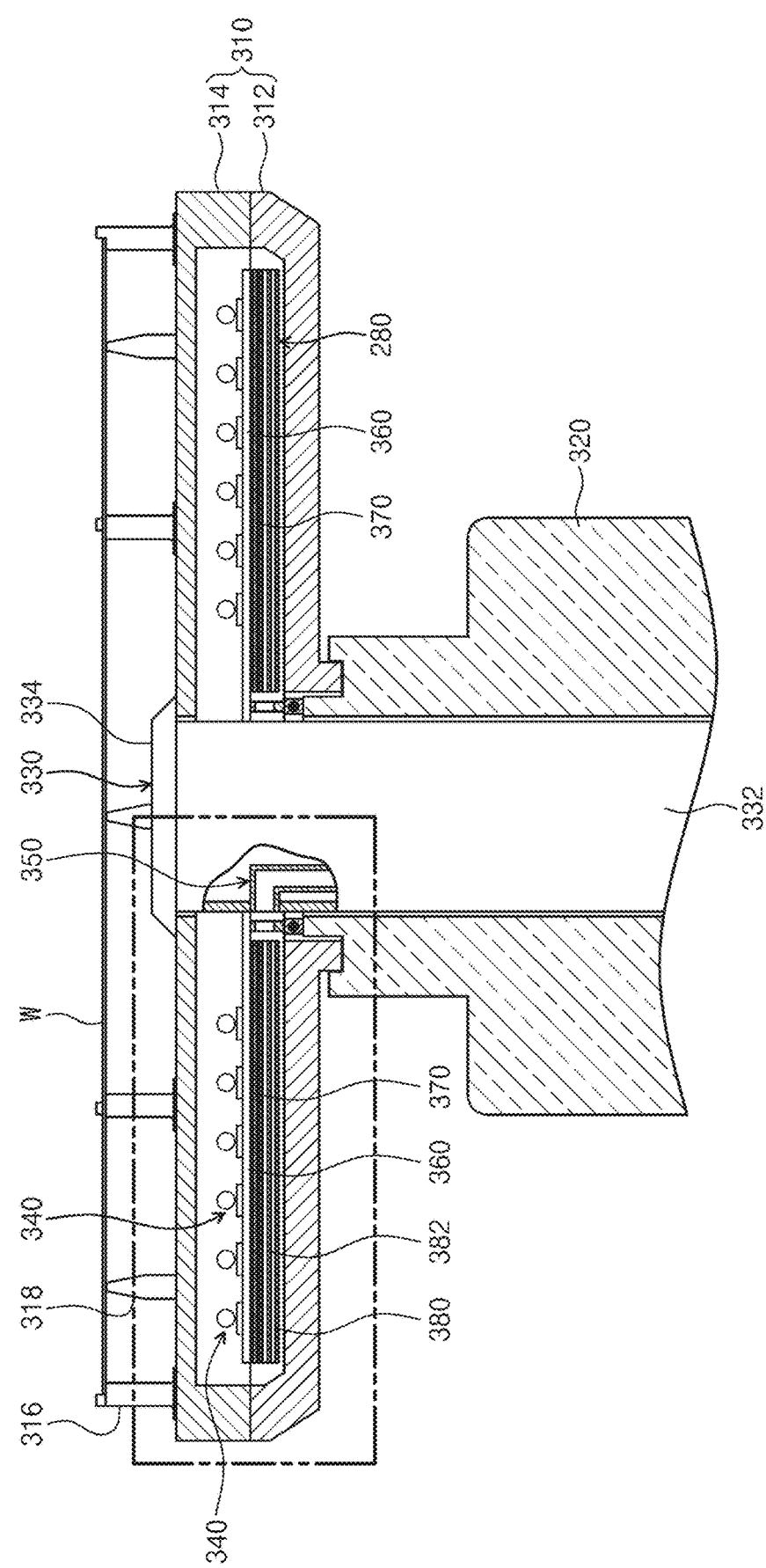
FIG. 4 is a sectional view illustrating one embodiment of a support unit of FIG. 3.
Figure 5:
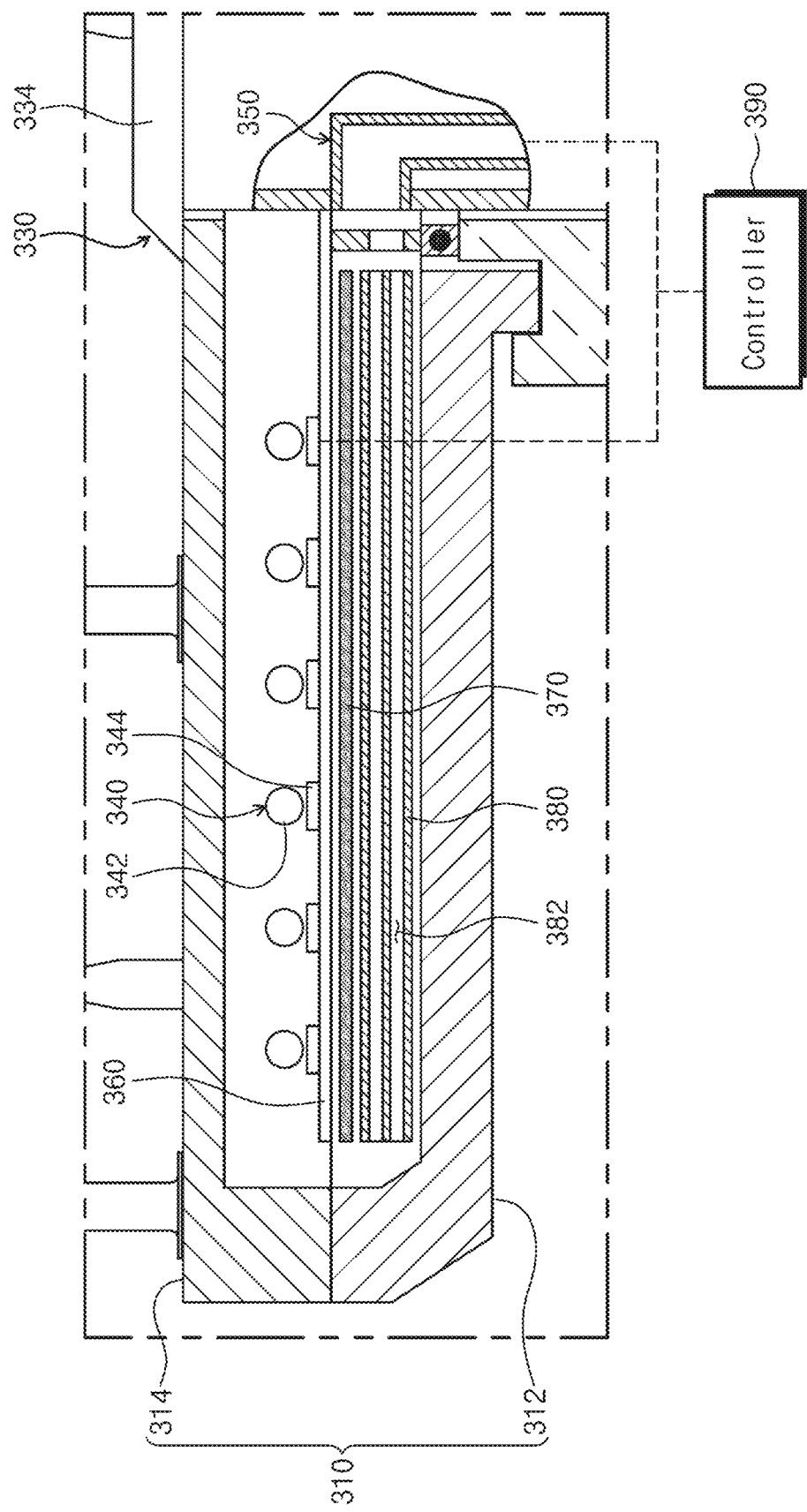
FIG. 5 is an enlarged view illustrating part of the support unit of FIG. 4.

FIG. 4 is a sectional view illustrating one embodiment of the support unit of FIG. 3, and FIG. 5 is an enlarged view illustrating part of the support unit of FIG. 4. Referring to FIGS. 4 and 5, the support unit 300 may support and rotate the substrate W during a process.

The support unit 300 includes a support plate 310, a spin actuator 320, a back nozzle 330, a heating member (or alternatively, a heater) 340, a cooling member (or alternatively, a cooler) 350, a heat insulating plate 360, a reflective plate 370, a heat dissipation plate 380, and a controller 390.

The support plate 310 includes a chuck stage 312 and a quartz window 314. The chuck stage 312 has a circular upper surface. The chuck stage 312 is coupled with and rotated by the spin actuator 320. Chucking pins 316 are installed on the periphery of the chuck stage 312. The chucking pins 316 pass through the quartz window 314 and protrude above the quartz window 314. The chucking pins 316 align the substrate W to locate the substrate W, which is supported by a plurality of support pins 318, in a correct position. During a process, the chucking pins 316 make contact with the side of the substrate W to prevent the substrate W from deviating from the correct position.

The quartz window 314 is located over the chuck stage 312. The quartz window 314 protects the heating member 340. The quartz window 314 may be transparent. The quartz window 314 may be rotated together with the chuck stage 312. The quartz window 314 includes the support pins 318. The support pins 318 are disposed on the periphery of an upper surface of the quartz window 314 and are spaced apart from each other at predetermined intervals. The support pins 318 protrude upward from the quartz window 314. The support pins 318 support the backside of the substrate W to space the substrate W apart upward from the quartz window 314.

The spin actuator 320 has a hollow shape. The spin actuator 230 is coupled with the chuck stage 312 and rotates the chuck stage 312. When the chuck stage 312 is rotated, the quartz window 314 may be rotated together with the chuck stage 312. Furthermore, components provided inside the support plate 310 may be located independently from the rotation of the support plate 310. For example, the heating member 340, the heat insulating plate 360, the reflective plate 370, and the heat dissipation plate 380, which will be described below, may be located independently from the rotation of the support plate 310.

The back nozzle 330 dispenses a chemical onto the backside of the substrate W. The back nozzle 330 includes a nozzle body 332 and a chemical dispensing part 334. The chemical dispensing part 334 is located on a central portion of the quartz window 314. The nozzle body 332 is axially inserted through the hollow spin actuator 320. The nozzle body 332 may have a chemical delivery line, a gas supply line, and a purge gas supply line therein. The chemical delivery line supplies an etchant for etching the backside of the substrate W to the chemical dispensing part 334. The gas supply line supplies a nitrogen gas for adjustment of etch uniformity to the backside of the substrate W. The purge gas supply line supplies a nitrogen purge gas to prevent the etchant from infiltrating between the quartz window 314 and the nozzle body 332.

The heating member 340 may heat the substrate W during a process. The heating member 340 is disposed inside the support plate 310. The heating member 340 includes a lamp (e.g., a plurality of lamps) 342 and a temperature controller 344.

The lamp 342 is installed over the chuck stage 312. The lamp 342 may have a ring shape. A plurality of lamps 342 may be provided. The lamps 342 may have different diameters. The lamps 342 may be controlled by temperature controllers 344, respectively. The lamps 342 may be lamps that emit light. The lamps 342 may be lamps that emit light having a wavelength in an infrared range. The lamps 342 may be infrared (IR) lamps. The lamps 342 may emit infrared light to heat the substrate W.

The heating member 340 may be subdivided into a plurality of concentric sections. The lamps 342 may be provided in the sections to individually heat the sections. The lamps 342 may be ring-shaped lamps concentrically arranged at different radii with respect to the center of the chuck stage 312. Although six lamps 342 are illustrated in this embodiment, this is merely illustrative, and the number of lamps 342 may be increased or decreased depending on the degree to which the temperature of the substrate W is controlled to a desired temperature. The heating member 340 may continuously raise or lower temperature depending on the radius of the substrate W during a process, by controlling the temperatures of the individual sections.

The cooling member 350 may supply a cooling fluid into the support plate 310. For example, the cooling member 350 may supply the cooling fluid into a fluid channel 382 formed inside the heat dissipation plate 380 that will be described below.

The heat insulating plate 360 is disposed inside the support plate 310. The heat insulating plate 360 is disposed below the heating member 340 inside the support plate 310. The heat insulating plate 360 may be formed of a transparent material. Light emitted from the heating member 340 may pass through the transparent heat insulating plate 360. The heat insulating plate 360 may be formed of a material having a low thermal conductivity. For example, the heat insulating plate 360 may be formed of a material having a lower thermal conductivity than the heat dissipation plate 380 that will be described below. For example, the heat insulating plate 360 may be formed of a material containing glass. The heat insulating plate 360 may be formed of a material containing neoceram. The heat insulating plate 360 may be formed of a material containing glass ceramic. Without being limited thereto, however, the heat insulating plate 360 may be formed of a material containing ceramic.

The reflective plate 370 is disposed inside the support plate 310. The reflective plate 370 is disposed under the heat insulating plate 360 inside the support plate 310. The reflective plate 370 may be formed of a material that reflects light emitted from the heating member 340. The reflective plate 370 may be formed of a material that reflects light having a wavelength in the infrared range. The reflective plate 370 may be formed of a material containing metal. The reflective plate 370 may be formed of a material containing aluminum. The reflective plate 370 may be formed of a material containing silver-plated aluminum, the surface of which is plated with silver (Ag).

The heat dissipation plate 380 may release, to the outside, heat transferred from the heat insulating plate 360. The fluid channel 382, through which the cooling fluid supplied by the cooling member 350 flows, may be formed inside the heat dissipation plate 380. The heat dissipation plate 380 is disposed inside the support plate 310. The heat dissipation plate 380 is disposed under the reflective plate 370 inside the support plate 310. The heat dissipation plate 380 may be formed of a material having a high thermal conductivity. For example, the heat dissipation plate 380 may be formed of a material having a higher thermal conductivity than the heat insulating plate 360 described above. The heat dissipation plate 380 may be formed of a material containing metal. The heat dissipation plate 380 may be formed of a material containing aluminum and/or silver.

The controller 390 may control the substrate treating apparatus 10. For example, the controller 390 may control the support unit 300 and the liquid supply unit 400. The controller 390 may control the support unit 300 and the liquid supply unit 400 to perform operations of the substrate treating apparatus 10 and a substrate treating method that will be described below.

Figure 6:
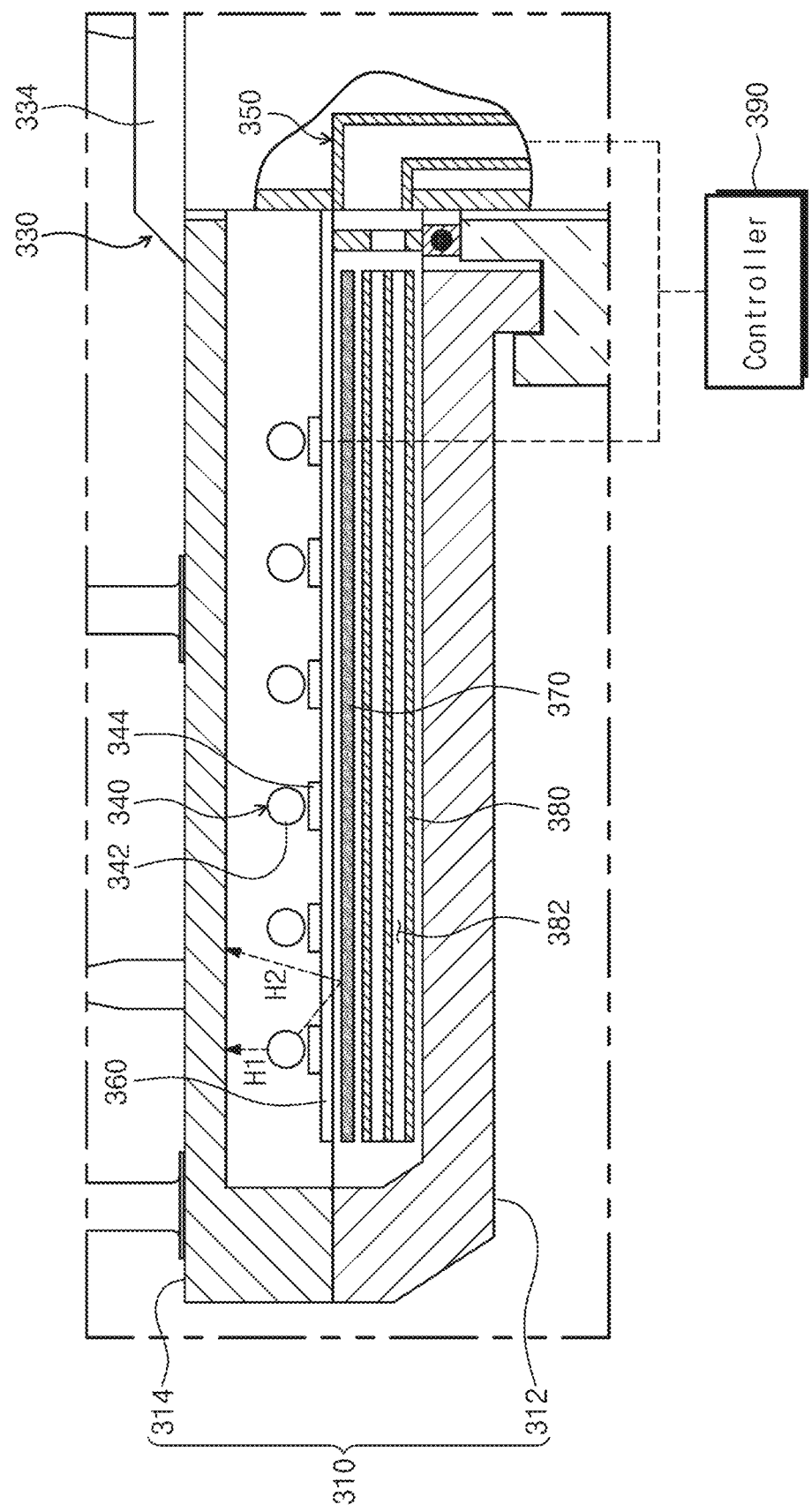
FIG. 6 is a view illustrating a state in which the support unit of FIG. 4 heats a substrate.

FIG. 6 is a view illustrating a state in which the support unit of FIG. 4 heats a substrate. Referring to FIG. 6, the heating member 340 may heat the substrate W. For example, the lamp 342 of the heating member 340 may heat the substrate W by emitting light having a wavelength in the infrared range. The heat by which the heating member 340 heats the substrate W may include direct radiant heat H1 and indirect radiant heat H2. The direct radiant heat H1 refers to heat directly transferred to the substrate W by infrared light emitted from the heating member 340. The indirect radiant heat H2 refers to heat transferred to the substrate W by infrared light that is emitted from the heating member 340 and then reflected from the reflective plate 370. According to an embodiment of the inventive concept, the direct radiant heat H1 and the indirect radiant heat H2 are collected on the substrate W to improve efficiency in heating the substrate W. Furthermore, the heat insulating plate 360 is formed of a material having a low thermal conductivity. Accordingly, the heat insulating plate 360 may minimize the transfer of heat remaining inside the support plate 310 to the spin actuator 320 by downward conduction.

A temperature rise of the spin actuator 320 is greatly affected by radiant heat of light that is emitted from the heating member 340 and that has a wavelength in the infrared range. According to an embodiment of the inventive concept, the heat insulating plate 360 is formed of a transparent material. The reflective plate 370 disposed under the heat insulating plate 360 is formed of a material that reflects light having a wavelength in the infrared range. For example, the reflective plate 370 may be formed of an aluminum material, the surface of which is plated with silver (Ag). That is, according to the embodiment of the inventive concept, light that is emitted from the heating member 340 and that has a wavelength in the infrared range is reflected upward by the reflective plate 370. Accordingly, the transfer of radiant heat of light having a wavelength in the infrared range to the spin actuator 320 may be minimized.

Figure 7:
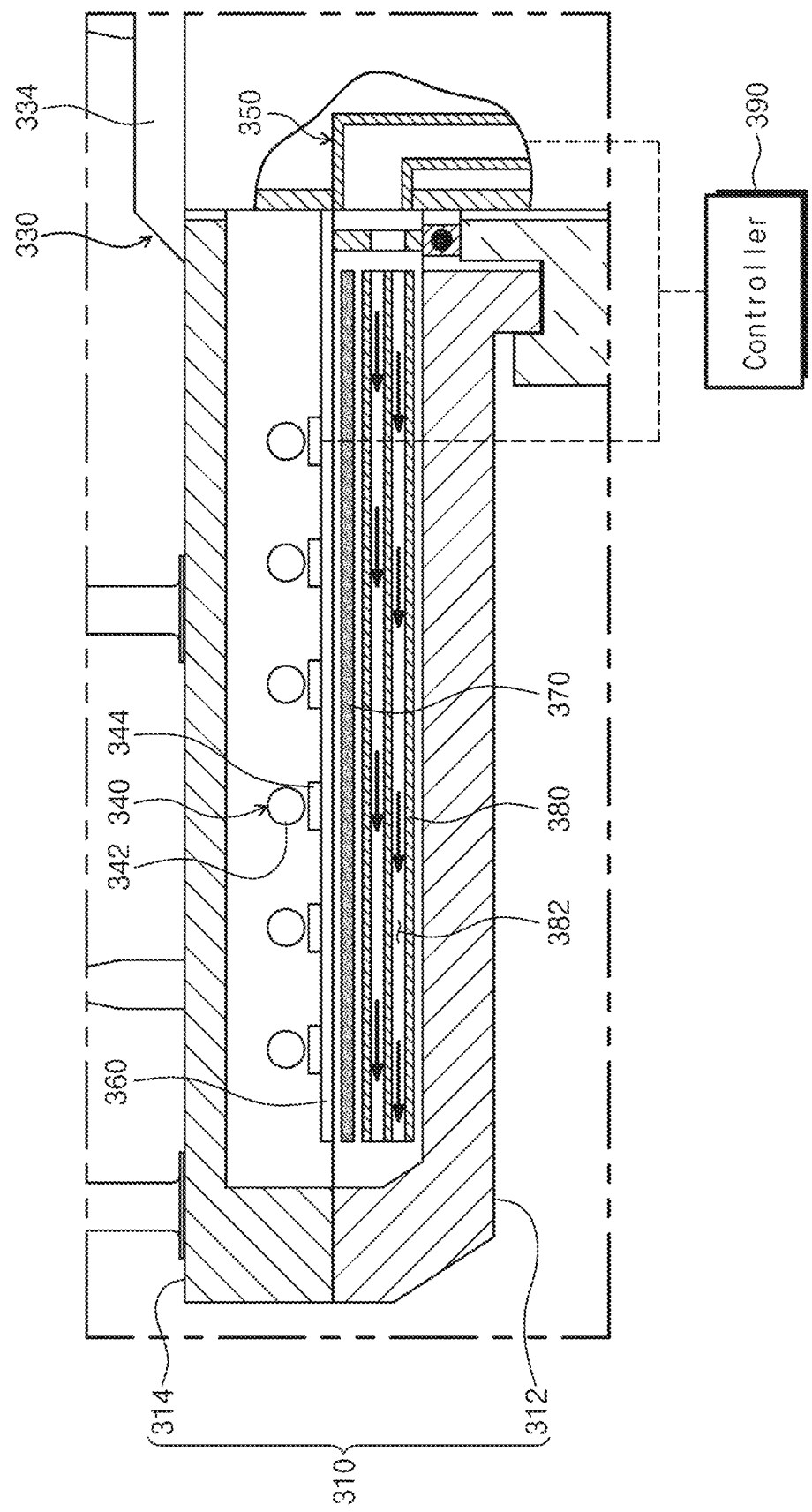
FIG. 7 is a view illustrating a state in which a fluid flows in the support unit of FIG. 4.

FIG. 7 is a view illustrating a state in which a fluid flows in the support unit of FIG. 4. The cooling member 350 may supply a cooling fluid into the fluid channel 382 formed inside the heat dissipation plate 380. The cooling fluid may be an inert gas or air. The inert gas may be a nitrogen gas, and the air may be an external air flow. The cooling fluid supplied into the heat dissipation plate 380 cools the heat dissipation plate 380 while circulating through the heat dissipation plate 380. As the heat dissipation plate 380 is cooled, a temperature rise of the spin actuator 320 may be minimized. Furthermore, the heat dissipation plate 380 may maintain the heat insulating plate 360 and the reflective plate 370 at constant temperatures.

According to an embodiment of the inventive concept, influences of components that transfer heat to the spin actuator 320 may be minimized by sequentially disposing the heat insulating plate 360, the reflective plate 370, and the heat dissipation plate 380 inside the support plate 310. The heat insulating plate 360, which is formed of a material having a low thermal conductivity, minimizes downward conduction of heat remaining inside the support plate 310. Furthermore, the reflective plate 370, which is formed of a material reflecting light having a wavelength in the infrared range, minimizes radiation of heat from the heating member 340 to the spin actuator 320. Moreover, the heat dissipation plate 380 formed of a material having a high thermal conductivity and the cooling fluid circulating through the fluid channel 382 formed inside the heat dissipation plate 380 may minimize convection of heat remaining inside the support plate 310 to the spin actuator 320. That is, according to the embodiment of the inventive concept, conduction, radiation, and convection of heat to the spin actuator 320 may all be blocked. Accordingly, even though the substrate W is heated by raising the output of the heating member 340, the transfer of heat to the spin actuator 320 may be minimized. In addition, according to the embodiment of the inventive concept, the output of the heating member 340 may be freely adjusted as the transfer of heat to the spin actuator 320 is minimized. Accordingly, the temperature of the substrate W may be freely adjusted depending on an etching rate (E/R) required for the substrate W.

To effectively reflect light emitted from the heating member 340, the reflective plate 370 may contain a material having excellent reflectance for light having a wavelength in the infrared range. The material having excellent reflectance for light having a wavelength in the infrared range may be exemplified by aluminum (Al), copper (Cu), or the like. However, due to high reactivity with heat, it is difficult to locate aluminum or copper directly below the heating member 340. Accordingly, a method in which gold (Au), silver (Ag), or rhodium (Rh) having relatively low reactivity with heat is applied to or deposited on the reflective plate 370 to form a thin film and the reflective plate 370 reflects light having a wavelength in the infrared range may be considered. However, in this case, the thin film formed on the reflective plate 370 may be discolored or stripped by light emitted from the heating member 340. Therefore, a hunting phenomenon may arise in which heat treatment is not uniformly performed on the substrate W, and reliability for treatment of the substrate W may not be ensured. Furthermore, gold (Au), silver (Ag), or rhodium (Rh) increases the manufacturing cost of the apparatus. However, according to an embodiment of the inventive concept, the heat insulating plate 360 containing a material such as glass is disposed over the reflective plate 370. The heat insulating plate 360 minimizes the transfer of heat generated by light emitted by the heating member 340 to the reflective plate 370. Accordingly, even though a relatively inexpensive material such as aluminum or copper is applied to the reflective plate 370, problems caused by thermal reactivity may be minimized, and an increase in the manufacturing cost of the apparatus may be minimized.

Figure 8:
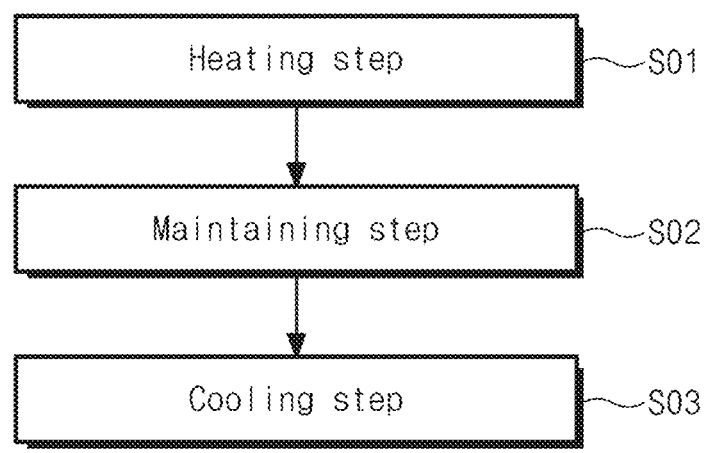
FIG. 8 is a flowchart illustrating a substrate treating method according to an embodiment of the inventive concept.
Figure 9:
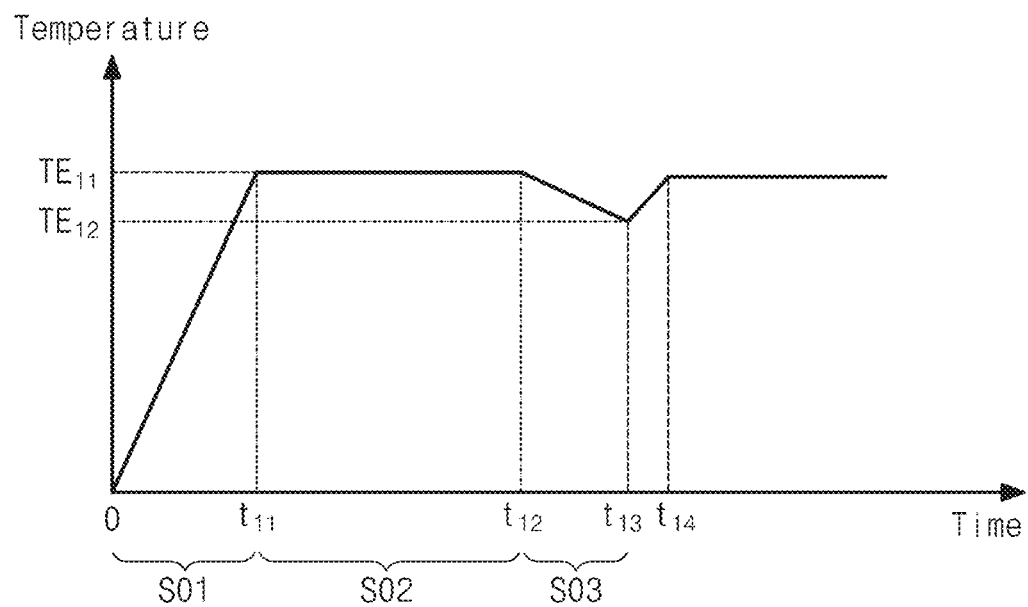
FIG. 9 is a view illustrating a temperature change of a substrate heated in the substrate treating apparatus according to an embodiment of the inventive concept.

FIG. 8 is a flowchart illustrating a substrate treating method according to an embodiment of the inventive concept, and FIG. 9 is a view illustrating a temperature change of a substrate heated in the substrate treating apparatus according to an embodiment of the inventive concept. Referring to FIGS. 8 and 9, the substrate treating method may treat a substrate by supplying a treatment liquid in a heated state to the substrate. The substrate treating method may include a heating step S01, a maintaining step S20, and a cooling step S03.

The heating step S01 is a step of heating the substrate. The heating step S01 may be performed while the liquid supply unit 400 supplies the treatment liquid to the substrate. In the heating step S01, the temperature of the substrate supported on the support plate 310 may be raised to a preset target temperature TE11.

The maintaining step S02 is a step of maintaining the temperature of the heated substrate at the target temperature TE1 for a set period of time (t11 to t12). The maintaining step S02 may be performed after the heating step S01. The set period of time (t11 to t12) in the maintaining step S02 may vary depending on the type of the substrate treated or the etching rate required for the substrate.

The cooling step S03 is a step of cooling the substrate. The cooling step S03 may be performed after the maintaining step S02. In the cooling step S03, the cooling member 350 may supply a cooling fluid into the fluid channel 382 formed inside the heat dissipation plate 380. When the above-described maintaining step S02 is continued, the spin actuator 320 may not normally operate due to a rise in the temperature of the spin actuator 320. Accordingly, in the cooling step S03, the cooling fluid is supplied into the heat dissipation plate 380 to prevent the temperature of the spin actuator 320 from being excessively raised.

The heating step S01, the maintaining step S02, and the cooling step S03 described above may be repeatedly performed. The heating step S01, the maintaining step S02, and the cooling step S03 may be performed on one substrate. A substrate subjected to the heating step S01 and the maintaining step S02 may be unloaded from the support unit 300 in the cooling step S03, and an untreated substrate may be loaded onto the support unit 300. When the untreated substrate is loaded onto the support unit 300, the heating step S01, the maintaining step S20, and the cooling step S03 may be performed again.

Figure 10:
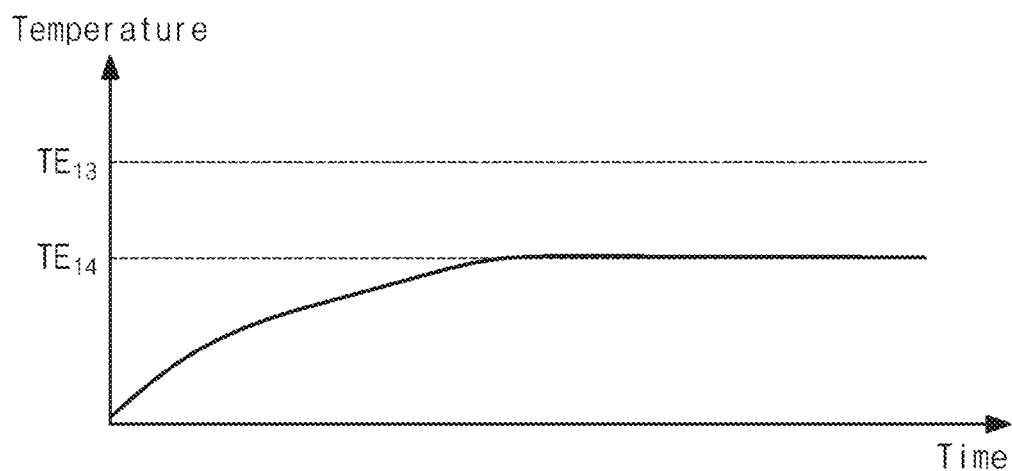
FIG. 10 is a view illustrating a temperature change of a spin actuator in the substrate treating apparatus according to an embodiment of the inventive concept.

FIG. 10 is a view illustrating a temperature change of the spin actuator in the substrate treating apparatus according to an embodiment of the inventive concept. Referring to FIG. 10, in the embodiment of the inventive concept, the heat insulating plate 360 minimizes heat conduction, the reflective plate 370 reflects light emitted by the heating member 340 upward, and the heat dissipation plate 380 effectively releases heat. Therefore, the temperature of the spin actuator 320 may be maintained at a temperature of T14 that is lower than a reference temperature of T13 at which the spin actuator 320 is abnormally driven. Thus, abnormal operation of the spin actuator 320 may be minimized. In addition, the number of times that the spin actuator 320 fails may be minimized.

As described above, according to the embodiments of the inventive concept, the support unit, the substrate treating apparatus, and the substrate treating method may efficiently treat a substrate.

Furthermore, according to the embodiments of the inventive concept, the support unit, the substrate treating apparatus, and the substrate treating method may improve an etching rate for a substrate.

In addition, according to the embodiments of the inventive concept, the support unit, the substrate treating apparatus, and the substrate treating method may minimize a rise in the temperature of a spin actuator while maintaining a substrate at high temperature.

Effects of the inventive concept are not limited to the above-described effects, and any other effects not mentioned herein may be clearly understood from this specification and the accompanying drawings by those skilled in the art to which the inventive concept pertains.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
   a support unit configured to support the substrate; and
   a liquid supply configured to supply a treatment liquid to the substrate supported on the support unit,
   wherein the support unit includes,
   a support plate on which the substrate is placed,
   a heater inside the support plate and configured to heat the substrate placed on the support plate,
   a heat insulating plate inside the support plate and under the heater,
   a reflective plate inside the support plate and under the heater, and
   a heat dissipation plate inside the support plate and under the reflective plate,
   wherein the heat dissipation plate includes a fluid channel configured to flow a cooling fluid therethrough, and
   wherein each of the heat insulating plate and the reflective plate vertically overlaps an entirety of the heater.

2. The apparatus of claim 1, wherein the heater includes a plurality of lamps configured to emit light.

3. The apparatus of claim 2, wherein each of the plurality of lamps is configured to emit light having a wavelength in an infrared range.

4. The apparatus of claim 3, wherein the reflective plate is formed of a material including silver-plated aluminum capable of reflecting the light having the wavelength in the infrared range.

5. The apparatus of claim 1, wherein the heat insulating plate is formed of a transparent material.

6. The apparatus of claim 1, wherein the heat insulating plate is formed of a material containing ceramic or glass.

7. The apparatus of claim 1, wherein the heat dissipation plate is formed of a material containing metal.

8. The apparatus of claim 1, wherein the heat dissipation plate is formed of a material having a higher thermal conductivity than the heat insulating plate.

9. The apparatus of claim 1, wherein
   the support plate is configured to be rotatable, and
   the heater, the heat insulating plate, the reflective plate, and the heat dissipation plate are located independently from rotation of the support plate.

10. The apparatus of claim 2, wherein the plurality of lamps include a plurality of ring-shaped lamps having different radii, the plurality of ring-shaped lamps being concentric with one another.

11. A method for treating a substrate using the apparatus of claim 1, wherein
    the substrate is treated by supplying the treatment liquid in a heated state to the substrate, and
    the substrate is heated while the treatment liquid is supplied to the substrate.

12. The method of claim 11, wherein the method comprises:
    heating the substrate supported on the support plate to a preset target temperature;
    maintaining temperature of the substrate at the preset target temperature for a set period of time; and
    cooling the substrate when the set period of time elapses.

13. The method of claim 11, wherein the treatment liquid includes a sulfuric acid or a phosphoric acid.

14. The apparatus of claim 1, wherein the apparatus further comprises:

a cooler configured to supply the cooling fluid into the fluid channel; and a controller configured to control the heater and the cooler, wherein the controller is configured to, control the heater to raise temperature of the substrate to a preset target temperature, maintain the temperature of the substrate at the preset target temperature for a set period of time, and control the cooler to cool the substrate when the set period of time elapses.

15. A support unit for supporting a substrate, the support unit comprising:
- a support plate having an interior space, the substrate being placed on the support plate;
- a heater in the interior space and configured to heat the substrate placed on the support plate;
- a heat insulating portion in the interior space and under the heater;
- a reflective portion in the interior space and under the heater; and
- a heat dissipation portion in the interior space and under the heat insulating portion,
- wherein the heat dissipation portion includes a fluid channel configured to flow a cooling fluid supplied by a cooler therethrough, and
- wherein each of the heat insulating portion and the reflective portion vertically overlaps an entirety of the heater.

16. The support unit of claim 15, wherein
the heater includes a lamp configured to emit light, and
the heat insulating portion is formed of a transparent material.

17. The support unit of claim 16, wherein the heat insulating portion is formed of a material containing glass.

18. The support unit of claim 16, wherein
the lamp is configured to emit light having a wavelength in an infrared range, and
wherein the reflective portion is formed of a material configured to reflect the light.

19. The support unit of claim 16, wherein the lamp includes a plurality of ring-shaped lamps having different radii, the plurality of ring-shaped lamps being concentric with one another.

20. The support unit of claim 15, wherein the heat dissipation portion is formed of a material having a higher thermal conductivity than the heat insulating portion.

21. The support unit of claim 15, wherein a controller configured to,
control the support unit,
control the heater to raise temperature of the substrate to a preset target temperature,
maintain the temperature of the substrate at the preset target temperature for a set period of time, and
control the cooler to cool the substrate when the set period of time elapses.

* * * * *